United States Patent [19]

Masi et al.

[11] Patent Number: 4,717,876

[45] Date of Patent: Jan. 5, 1988

[54] NMR MAGNET SYSTEM FOR WELL LOGGING

[75] Inventors: Charles G. Masi, Newbury, Mass.; Melvin N. Miller, Wynnewood, Pa.

[73] Assignee: Numar, Malvern, Pa.

[21] Appl. No.: 896,357

[22] Filed: Aug. 13, 1986

[51] Int. Cl.⁴ ............................................. G01R 33/20
[52] U.S. Cl. .................................... 324/303; 324/300; 335/306
[58] Field of Search ............... 324/300, 303, 221, 232, 324/220, 346, 319, 301, 318; 335/209, 299, 302, 306

[56] References Cited

U.S. PATENT DOCUMENTS

| | | | |
|---|---|---|---|
| 3,114,876 | 12/1963 | Schuster | 324/221 |
| 3,213,357 | 10/1965 | Brown et al. | 324/303 |
| 4,297,637 | 10/1981 | Crooks et al. | 324/307 |
| 4,350,955 | 9/1982 | Jackson et al. | 724/303 |
| 4,498,048 | 2/1985 | Lee et al. | 324/318 |
| 4,629,986 | 12/1986 | Clow et al. | 324/318 |

OTHER PUBLICATIONS

A. Timur, "Pulsed Nuclear Magnetic Resonance Studies of Porosity, Movable Fluid, and Permeability of Sandstones", Journal of Petroleum Technology, Jun. '69, p. 775.
R. C. Herrick, S. H. Couterie and D. L. Best, "An Improved Nuclear Magnetism Logging System and Its Application to Formation Evaluation", SPE 8361 presented at the 54th Annual Fall Technical Conference and Exhibition of the Society of Petroleum Engineers of AIME, held in Las Vegas, Nebr., Sep. 23-26, 1979.
R. K. Cooper and J. A. Jackson, "Remote (Inside-Out) NMR. I. Remote Production of a Region of Homogeneous Magnetic Field", J. Magn. Reson. 41,400 (1980).
L. J. Burnett and J. A. Jackson, "Remote (Inside-Out) NMR. II, Sensitivity of NMR Detection for External Samples", J. Magn. Reson. 41,406 (1980).
J. A. Jackson, L. J. Burnett and J. F. Harmon, Remote (Inside-Out) NMR. III, Detection of Nuclear Magnetic Resonance in a Remotely Produced Region of Homogeneous Magnetic Field, J. Magn. Reson. 41,411 (1980).

Primary Examiner—Stewart J. Levy
Assistant Examiner—Kevin D. O'Shea
Attorney, Agent, or Firm—Caesar, Rivise, Bernstein, Cohen & Pokotilow, Ltd.

[57] ABSTRACT

A magnetic structure for producing a substantially uniform magnetic field in a region external to the structure. The field produced has a predetermined magnitude but with all of its first and second order partial derivatives with respect to spatial coordinates being equal to zero at any selected point within the uniform region. The structure includes a pair of elongated magnets which are magnetized along their longitudinal axis. The magnets are spaced from each other with their corresponding end poles facing each other. A pair of annular cylindrical magnets which are magnetized in a radial direction are mounted on the end faces of each of the elongated magnets. Another annular cylindrical magnet, also having its magnetization oriented in a radial direction is located on the midplane between the two elongated magnets. The combined effect of these magnets is to create a uniform toroidal field. This field is particularly suitable for use in NMR oil well logging applications.

46 Claims, 7 Drawing Figures

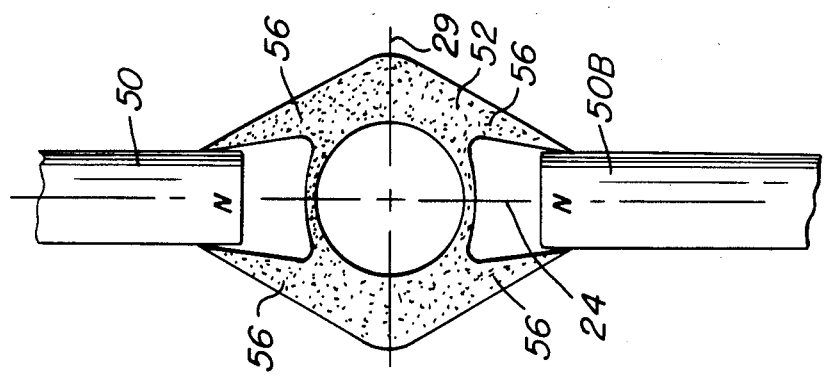
FIG.6 PRIOR ART
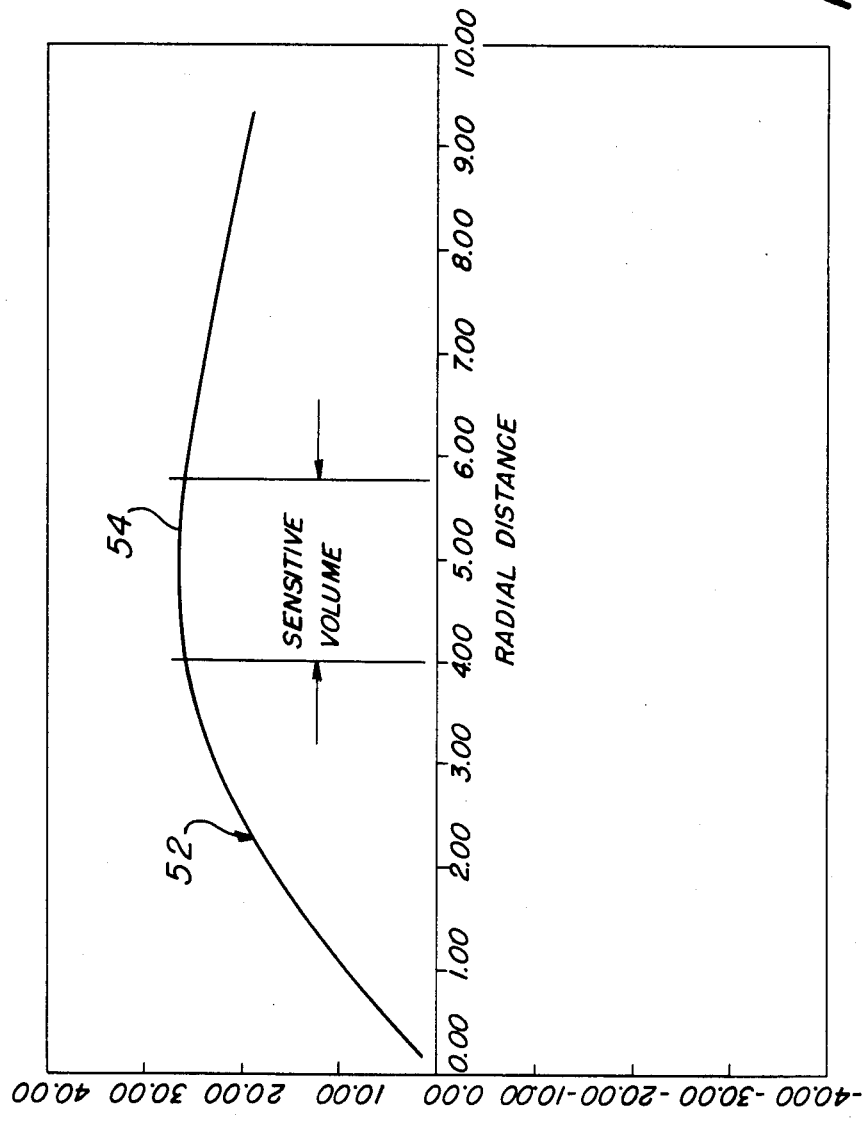
FIG.4 PRIOR ART BUT WITH NEODYMIUM-IRON BORON OR RARE EARTH COBALT MAGNETIC MATERIALS

NMR MAGNET SYSTEM FOR WELL LOGGING

BACKGROUND OF THE INVENTION

This invention relates generally to magnetic structures and more particularly to magnetic structures which are particularly suited for use in nuclear magnetic resonance applications such as for well logging.

Before describing the background of the subject invention it should be pointed out that, while the subject invention is particularly suited for use in NMR systems for well logging, the magnetic structures of this invention can be used in other application as well. Thus there is no intention to limit the generality of the present invention to the field of NMR well logging.

As is known fluid flow properties of porous media have long been of interest in the oil industry. A timur "Pulsed Nuclear Magnetic Residence Studies of Porosity, Movable Fluid, and Permeability of Sandstones," in the Journal of Petroleum Technology, June 1969, page 775, proved experimentally that NMR methods provide a rapid non-destructive determination of porosity, movable fluid, and permeability of rock formation.

It is known that when an assembly of magnetic moments, such as those of hydrogen nuclei, are exposed to a static magnetic field they tend to align along the direction of the magnetic field, resulting in bulk magnetization. The rate at which equilibrium is established in such bulk magnetization upon provision of a static magnetic field is characterized by the parameter, T1, known as the spin-lattice relaxation time.

It has been observed that the mechanism which determines the value of T1 depends on molecular dynamics. In liquids, molecular dynamics are a function of molecular size and inter-molecular interactions. Therefore, water and different types of oil have different T1 values.

In the heterogenous media, such as a porous solid which contains liquid in its pores, the dynamics of the molecules close to the solid surface are also significant and differ from the dynamics of the bulk liquid. It may thus be appreciated that the T1 parameter provides valuable information relating to well logging parameters.

There exist a number of techniques for disturbing the equilibrium of an assembly of magnetic moments, such as those of hydrogen nuclei, for T1 parameter measurements. Each of these techniques provides means for measuring T1 of a rock formation within a certain volume (called the "sensitive volume") which is determined mainly by the shape of the magnetic field surrounding the magnetic structure. The signal-to-noise ratio of the measurement is limited by the ratio of the volume of the sensitive volume to the uniformity (maximum flux density minus minimum flux density) of the magnetic field within said volume, and increases in proportion to this ratio.

In any given nuclear magnetic resonance instrument configuration, the apparatus will respond only to nuclei residing within the sensitive volume. In the present invention and prior art instruments described herein, the boundaries of the sensitive volume are determined by radiation patterns of transmitting and receiving antennae as well as a combination of the detailed structure of the magnetic field with the receiver's frequency passband. The radio frequency that a given nucleus will respond to or emit when excited is proportional to the flux density of the magnetic field in which it is immersed. The proportionality factor depends upon the nuclear species. For hydrogen nuclei, that factor is 42.5759 MHz/Tesla. If the NMR receiver's passband extends from 1.30 MHz to 1.31 MHz, the instrument will be sensitive to hydrogen nuclei in regions of the magnetic field that have flux densities between 30.5 mT and 30.8 mT, providing the antenna radiation pattern allows receiving sufficient signal from that locations. If it is desired to study nuclei located with a particular region, the magnetic field structure, antenna radiation pattern and receiver passband must all be adjusted to be sensitive to that and only that region. Since the signal-to-noise ratio of the resulting signal is proportional to (among other factors) the square root of the receiver passband width, it is important to minimize the variation of the magnetic field within the desired sensitive volume; smaller variations (better field uniformity) mean a better signal-to-noise ratio. Since the signal-to-noise ratio also increases with increasing frequency, the nominal magnetic field intensity within the volume is also very important. It is immaterial whether this nominal intensity is defined as the central value, average value on some other value within the range of values encompassed by the sensitive volume because only large differences in signal-to-noise ratio are significant.

One technique for measuring T1 of a rock formation is exemplified by what is known as the "Schlumberger Nuclear Magnetic Logging Tool". That tool is described by R. C. Herrick, S. H. Couturie, and D. L. Best in "An Improved Nuclear Magnetic Logging System and Its Application to Formation Evaluation", SPE8361 presented at the 54th Annual Fall Technical Conference and Exhibition of the Society of Petroleum Engineers of AIME, held in Las Vegas, Nev., Sept. 23–26, 1979, and also by R. J. S. Brown et al. in U.S. Pat. No. 3,213,357 entitled "Earth Formation and Fluid Material Investigation by Nuclear Magnetic Relaxation Rate Determination".

The Schlumberger Nuclear Magnetic Logging Tool measures the free precession of proton nuclear magnetic moments in the earth's magnetic field by applying a relatively strong DC polarizing field to the surrounding rock formation in order to align proton spins approximately perpendicularly to the earth's magnetic field. The polarizing field must be applied for a period roughly five times T1 (the spin-lattice relaxation time) for sufficient polarization (approximately two seconds). At the end of polarization, the field is turned off rapidly. Since the protons spins are unable to follow this sudden change they are left aligned perpendicularly to the earth's magnetic field and precess about this field at the "Larmor Frequency" corresponding to the local earth's magnetic field (roughly from 1300 to 2600 Hz, depending on location).

The spin precession induces in a pick-up coil a sinusoidal signal whose amplitude is proportional to the density of proton present in the formation. The signal decays with a time constant T2* (transverse relaxation time) due to non-homogeneities in the local magnetic field over the sensing volume.

While there have been improvements in the Schlumberger Nuclear Magnetic Logging Tool since its introduction, several of its disadvantages have still not been overcome. For example, the technique using the Schlumberger Nuclear Magnetic Logging tool involves a suppression of very high undesirable signals coming from the bore fluid which is in close proximity to the probe and thus requires doping of the bore fluid with para-magnetic materials. Needless to say this process is both costly and time consuming. Moreover, the Schlumberger nuclear magnetic logging technique is slow in carrying out a spin-lattice relaxation time (T1) measurement thereby limiting commercially operable speeds.

Another technique for non-destructive determination of porosity movable fluid and permeability of rock formation is the so-called "Los Alamos NMR Technique". That technique is described in the following publications: R. K. Cooper and J. A. Jackson, entitled "Remote (Inside-Outside) NMR. I—Production of a Region of Homogenous Magnetic Field," J. Magn. Reson. 41,400 (1980); L. J. Burnett and J. A. Jackson, entitled "Remote (Inside-Outside) NMR. II—"Sensitivity of NMR Detection for External Samples," J. Magn. Reson. 41,406 (1980); J. A. Jackson, L. P. Burnett and J. F. Harmon entitled "Remote (Inside-Outside) NMR. III—"Detection of Nuclear Magnetic Resonance in a Remotely Produced Region of Homogeneous Magnetic Field," J. Magn. Reson. 41,411 (1980); and U.S. Pat. No. 4,350,955 (Jackson et al.) entitled "Magnetic Resonance Apparatus".

The Los Alamos NMR technique is based on the development of a specific magnet/RF coil assembly. Such a structure allows one to obtain the NMR signal predominently from a toroidal or "doughnut" shaped region in the surrounding rock formation at a specified distance from the bore hole axis.

In U.S. Pat. No. 4,350,955 (Jackson et al.) the magnet structure for producing the field comprises a pair of elongated magnets disposed so that their corresponding opposing pole faces are separated by a predetermined distance. Using a magnet structure arranged in that manner results in the production of a field like that shown in FIG. 6 herein. Moreover, as can be seen in the corresponding graph of FIG. 4, the strength of the field produced on the midplane between the poles increases from zero on the axis of the magnets to a maximum, and then decays as the distance from the axis of the magnets increases. Furtherstill, the field is a constant maximum value over a short distance measured radially from the axis of the magnets. Thus, at the location of the maximum flux density a narrow region of uniform field is created, with the field itself being toroidal in shape.

The Los Alamos approach while offering some advantages over the Schlumberger technique, does not eliminate the bore fluid signal problem nor does it overcome the difficulty of unacceptably slow operational speeds due to a low signal-to-noise ratio. Recognizing these problems Jackson proposes to increase significantly the static magnetic field strength but admits that such is impractical with the present state of magnet technology.

OBJECTS OF THE INVENTION

Accordingly, it is the general object of the present invention to provide magnetic apparatus which overcomes the disadvantages of the prior art.

It is a further object of the present invention to provide a magnetic structure which produces a region of uniform static or slowly varying dynamic magnetic field external thereto.

It is still a further object of the present invention to provide a magnetic structure for generating a region of uniform static magnetic field external to the structure itself and particularly suitable for NMR applications.

It is still a further object of the present invention to provide a magnetic structure which is simple in construction, yet effective to produce uniform static field external thereto and wherein the field shape can be configured as desired.

SUMMARY OF THE INVENTION

These and other objects of the present invention are achieved by providing apparatus for producing a substantially uniform static or slowly varying dynamic magnetic field in a region external to said apparatus. The field has a predetermined magnitude, but with it's first order partial derivatives with respect to spatial coordinates being respective predetermined values at preselected points within the region. The apparatus includes first magnet means magnetized in a direction extending along a first predetermined axis and at least second magnetic means having at least one magnetization direction extending at an angle to the first axis.

DESCRIPTION OF THE DRAWING

Other objects and many of the attendant advantages of the instant invention will become readily apparent by reference to the accompanying drawings wherein:

FIG. 4 is a graph showing flux density as a function of radial distance for a prior art magnet structure;

FIG. 6 is a side elevational view of the prior art structure that produces the field depicted graphically in FIG. 4 and showing its sensitive volume.

DETAILED DESCRIPTION OF THE PREFERRED EMBODIMENT

Figure 1:
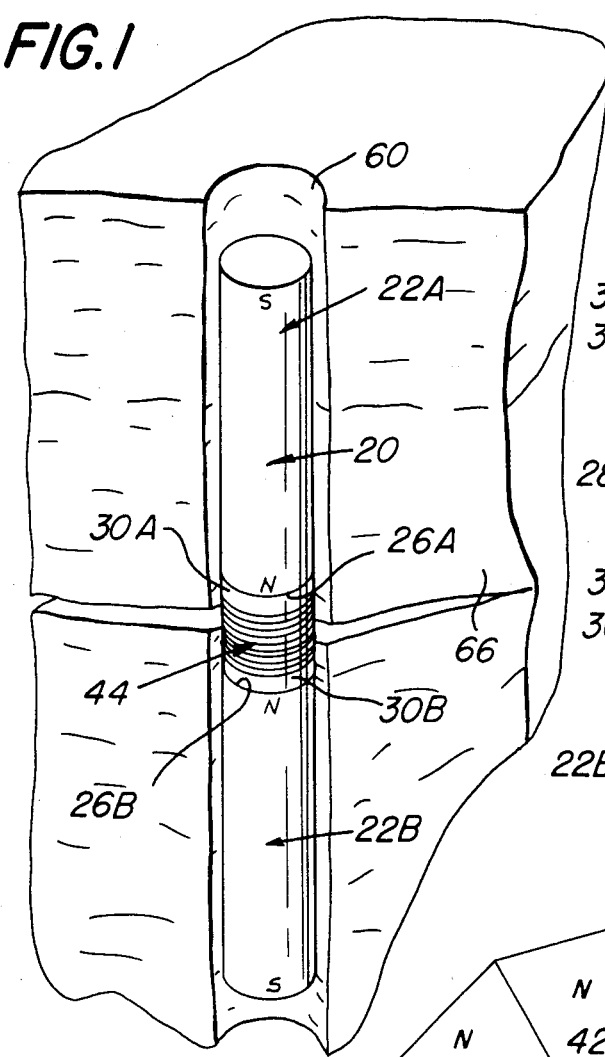
FIG. 1 is a perspective view of a magnetic structure constructed in accordance with this invention and used in an NMR system for logging a well hole.

Referring now to the various figures of the drawing wherein like reference characters refer to like parts, there is shown at 20 in FIG. 1 a magnetic structure or apparatus constructed in accordance with the instant invention. That structure is of particular utility in NMR oil well logging applications, but can be used in other NMR applications, or other applications involving the use of magnets for producing a uniform external field.

Figure 2:
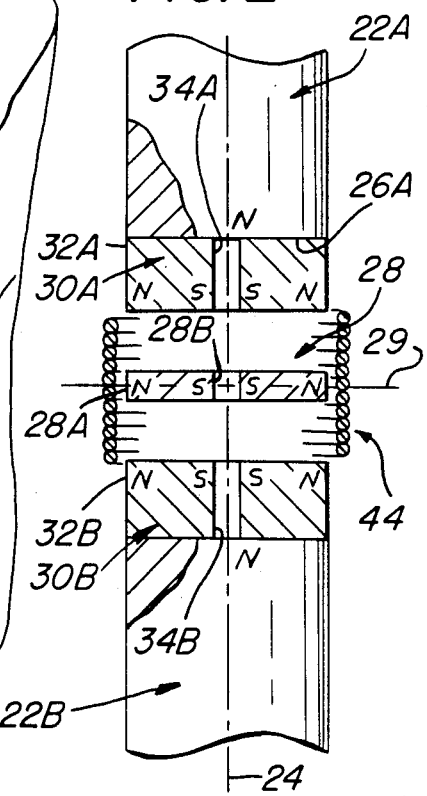
FIG. 2 is a side elevational view, particularly in section, and showing the magnet structure in the NMR system of FIG. 1.

In the embodiment of the invention shown herein the magnetic structure 20 produces a substantially toroidal region of substantially homogeneous magnetic field. However, the substantially toroidal homogeneous field region produced by the subject invention is homogeneous to more stringent criteria than produced by the prior art (Jackson et al. patent). In this connection the structure disclosed in the Jackson et al. patent produces a static magnetic field on a circle in the middle of the toroid and whose first partial derivatives of the field with respect to spatial coordinates are all equal to zero, but whose second partial derivatives with respect to such spatial coordinates are only equal to zero in one direction, (e.g., the azimuthal direction, $\theta$, in polar coordinates). In contradistinction, one preferred embodiment of this invention produces a magnetic field on a circle in the toroid with all of the first and second order partial derivatives of the field with respect to spatial coordinates being equal to zero. This latter characteristic is achieved by introducing additional magnetic field sources to the two axially aligned field sources of the Jackson et al. structure. In particular, the subject invention uses a pair of aligned, elongated magnets, like that disclosed by Jackson et al., and which are referred to as the main or large magnets. However, additional field sources (e.g., magnets) of appropriate size and shape are added to the aligned main magnets in order to change the field at the desired radial location. Thus, as can be seen in FIGS. 1 and 2, the magnetic structure 20 basically comprises two cylindrically shaped, elongated permanent magnets 22A and 22B. These main magnets are identical in construction to each other and are magnetized parallel to their longitudinal axis 24. Accordingly, each main magnet includes one end face 26 which defines one of the poles of the magnet. In the exemplary embodiment shown herein, the end face 26A of magnet 22A and end face 26B of magnet 22B are each the north pole. The opposite ends of the magnets 22A and 22B define the magnet's south poles.

It should be pointed out at this juncture that each of the opposed end faces 26A and 26B of the two main magnets could be the south pole, if desired.

One of the additional field sources comprises an annular cylinder or ring magnet 28 consisting of a high coercivity material which is located at the center of the two aligned main magnets, i.e., on the mid-plane 29. This ring magnet is referred to hereinafter as the mid-magnet, and, in accordance with the preferred embodiment of the invention, is magnetized radially, that is, from its center outward, rather than axially, as are aligned main magnets. Thus, the outer face 28A of the magnet 28 forms one pole, while its inner face, that is, the surface 28B of the central opening, forms the other pole. In the exemplary embodiment shown herein, the outer face 28A is the north pole, while face 28B is the south pole.

The mid-magnet 28 produces a field that greatly increases the main field (that is, the field produced by the main magnets 22A and 22B) at short radial distances along the mid-plane between the main magnets, but produces relatively less of an increase at large radial distances. The net effect is to greatly increase the field at short radial distances relative to that at larger radial distances.

As can be seen in FIG. 2, the mid-magnet 28 is relatively thin compared to other additional field sources to be described hereinafter, and is located relatively far from the poles of the main magnets. Therefore, the influence of the mid-ring magnet is relatively small, but it does increase the total field by a significant amount, e.g., ten per cent.

The other additional field sources of this invention comprise a pair of annular cylinders or ring magnets 30A and 30B and are disposed adjacent the opposing poles of the main magnets. Thus, as can be seen, the magnets 30A and 30B, respectively, surmount the end faces 26 of the two main magnets 22. It should be pointed out at this juncture that the magnets 30A and 30B can, if desired, be separated from the end faces 26A and 26B of the main magnets 22A and 22B, respectively, by a small gap, that may or may not be filled with any suitable diamagnetic material. In any case, each of the magnets 30A and 30B is also magnetized in a substantially radial direction, from its center outward. Thus, the outer face of each of the magnets defines one pole while the inner face defines the opposite pole. In the exemplary embodiment shown in FIG. 1, the outer face 32A of magnet 30A and the outer face 32B of magnet 30B are each the north pole, while the inner surfaces 34A and 34B of magnets 30A and 30B, respectively, are the south poles.

Figure 5:
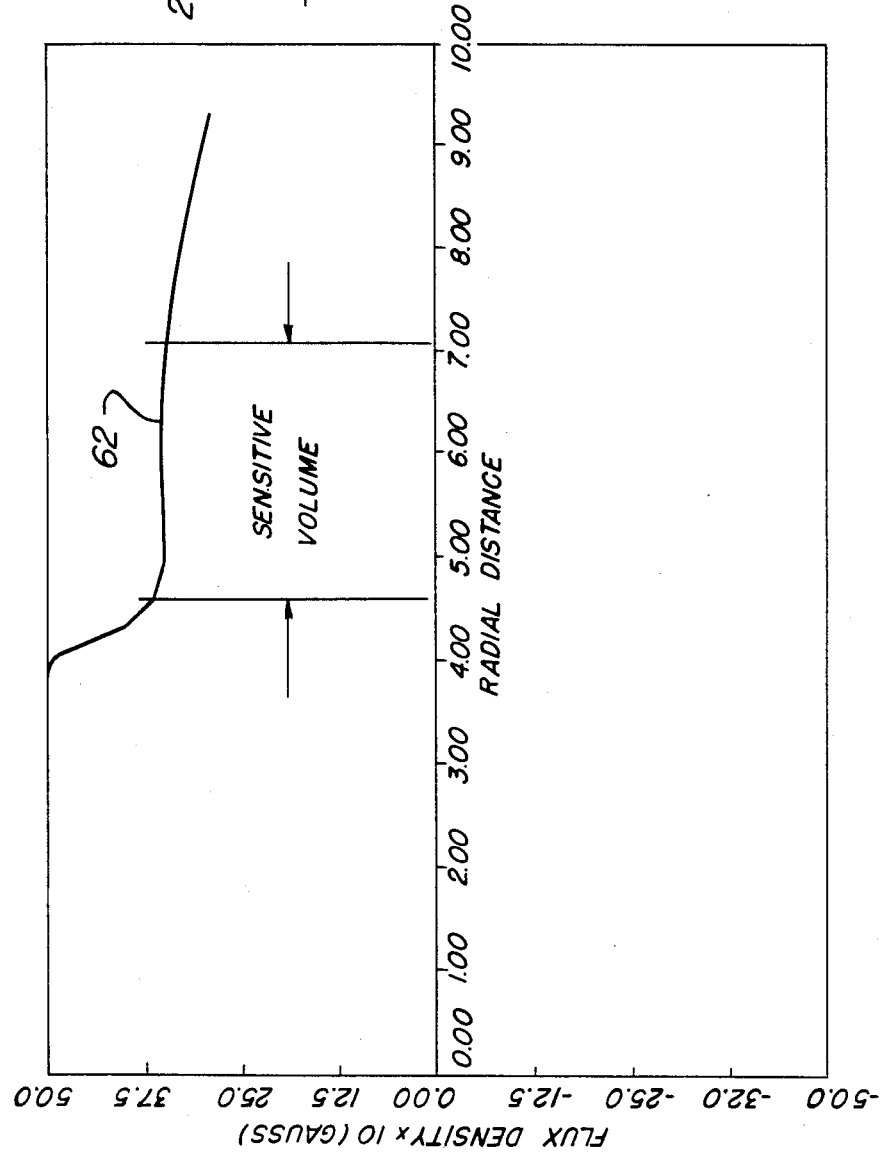
FIG. 5 is a graph like that of FIG. 4 but for the magnet structure of this invention.

The function of the magnets 30A and 30B is to increase the magnet intensity in the sensitive volume and move that volume further from the axis 24 by superimposing a secondary field that opposes the main field at small radial distances and reinforces it at large radial distances. Magnets 30A and 30B have the net effect of moving the sensitive volume radially outward on the mid-plane, while not significantly reducing the field strength at the new location. Thus, as can be seen in the graph of FIG. 5, the combination of the additional ring magnets with the main magnets produces a field with a new and flatter peak at a greater radial distance from the axis of the main magnets, thereby resulting in a wider sensitive volume with a stronger and more uniform field. With the use of higher coercivity magnets, the structure 20 can produce a field which is twice as large as that produced by the equivalent to magnet arrangement of the Jackson et al. patent at the same radial distance.

As will be appreciated by those skilled in the art, the subject invention enables one to have much greater control over the field strength and its uniformity than prior art by changing the dimensions, location and magnetic properties of the additional magnetic sources. In contradistinction, when one uses a structure consisting of only two magnets, such as disclosed by the Jackson et al. patent, one can only reduce the second partial derivatives of the field with respect to spatial coordinates within the region at a cost of reducing the field strength itself. By utilizing the additional magnetic field sources of this invention, one cannot only reduce all the second order partial derivatives of the field strength with respect to such spatial coordinates to zero, or to some predetermined value, but can simultaneously increase the field strength itself, thereby providing an improvement in the signal-to-noise ratio when the structure is used for NMR imaging. Moreover, since the more nearly uniform a field is, the greater the number of molecules available at the Larmor frequency the magnet structure of this invention contributes proportionally to the NMR measurement signal, thereby further increasing the signal-to-noise ratio.

Summing up, the field produced by only the main magnets 22A and 22B on the mid-plane 29 between their two poles 26A and 26B increases from zero on the axis 24 to a maximum, and then decays as the distance radially outward from axis 24 increases. Thus, there is a region measured radially from the axis 24 wherein the field is substantially constant (i.e., to within a given uniformity) and at its maximum flux density. However, this region is somewhat narrow. The use of the additional magnetic structures 28, 30A and 30B superimposes other fields on the field produced by main magnets to move the region of field uniformity radially outward, as shown in FIG. 5. To that end the use of the mid-magnet 28 greatly increases the magnitude of the main field on the center plane close to the axis 24 of the main magnets. Further away, the field produced by the magnet 28 adds proportionally much less to the main field. The two magnets 30A and 30B cause the flux density in the vicinity of the midplane to oppose the field resulting from the magnets 22A and 22B. These additional sources reduce the total field in the vicinity of the midplane, and cause the field to peak at a substantially larger radial distance and at the same time broaden the width of the peak to produce a more uniform field in the vicinity of the peak.

Figure 3:
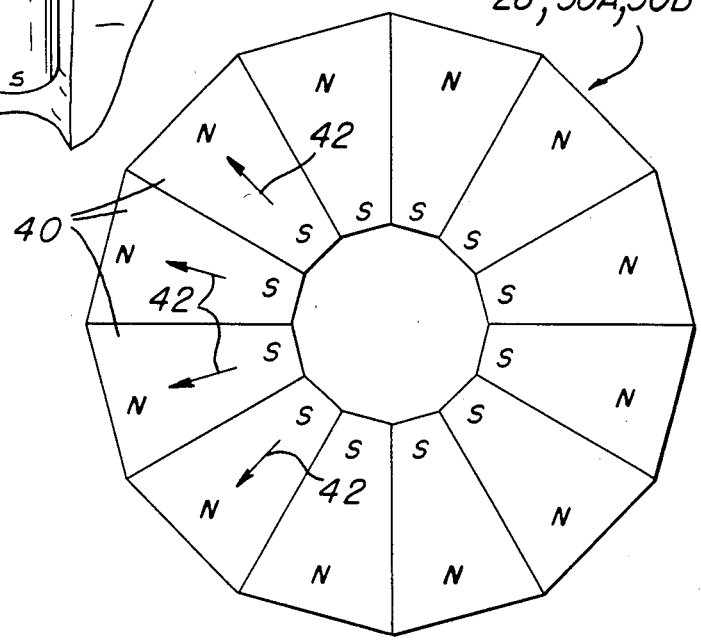
FIG. 3 is a plan view of an embodiment of portion(s) of the magnet structure shown in FIG. 2.

Various schemes can use current technology to produce the annular cylindrical magnets having substantially radial magnetization. In FIG. 3 there is shown one exemplary way to construct such annular cylindrical magnets. To that end, as can been seen, each annular cylinder magnet 28, 30A and 30B may consist of a plurality of trapezoidal segments 40, each having a uniform magnetization directed perpendicularly to the parallel sides thereof as shown by the arrows 42. Moreover, each trapezoidal segment can consist of one or more smaller segments held together, such as by anaerobic adhesive, to form the complete annular cylindrical shaped magnet structure.

The entire structure 20 in FIG. 1 may consist of a single kind of permanent magnet material, such as a rare-earth cobalt, or different components may consist of different kinds of material adapted to the particular needs of each part, e.g., alnico for the main magnets 22A and 22B and neodymium-iron for the annular cylindrical magnets 28, 30 and 30B.

When the magnetic structure 20 is used in NMR well logging applications an RF coil 44 of the NMR system is placed about the center ring magnet 28 and is symetrically disposed with respect to the pair of ring magnets 30A and 30B and associated main magnets 22A and 22B, as shown in FIG. 2. In the interests of optimal signal transmission and reception the magnetic components of this invention disposed closely adjacent the coil 44 are preferably formed of materials that have low electrical conductivity, such sintered rare-earth cobalt bonded in epoxy, neodymium-iron-boron bonded in epoxy, or ferrite.

As mentioned earlier, FIG. 6 shows the magnet structures of the Jackson et al. patent. In particular, that structure includes a pair of elongated main magnets 50A and 50B. The field produced by these magnets is shown and designated by reference numeral 52. As can be seen in FIG. 6 and in the corresponding graph of FIG. 4 the magnetic intensity of the field is zero at the midpoint between the magnets and at points on the midplane 29 between the magnets it rises to a maximum 54 and then falls at points further from center. In the region near the peak the field intensity is approximately uniform. However, the region of approximately uniform field intensity has skirts 56 (FIG. 6) that extend off the midplane at greatly reduced radial distances. Accordingly, when a magnet structure constructed as in Jackson et al. is utilized for oil well logging a significant fraction of the NMR signal is allowed to emanate from these skirts in the contaminated volume immediately adjacent to the borehole 60 (FIG. 1).

Figure 7:
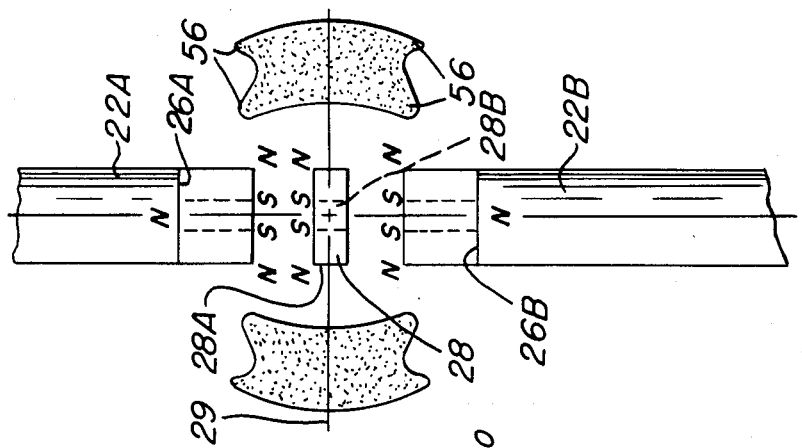
FIG. 7 is a view similar to that of FIG. 6 but showing the magnet structure of this invention and its sensitive volume.

In contradistinction, as be can be seen in FIGS. 5 and 7, the subject invention by utilizing the additional magnetic sources greatly reduces the volume of the uniform field intensity region's skirts 56 (FIG. 7) and increases its peak 62 (FIG. 5) width, and therefore its volume near the midplane 29. The field intensity at the peak 62 is also significantly higher.

As will be appreciated from the foregoing the introduction of the additional field sources as compared to the two axially arranged field sources (magnets) of the Jackson et al. patent serve as the mechanism of satisfying a desired goal of causing all partial second derivatives of the field to be zero, thereby creating a more strictly homogenous region. An additional benefit of the use of the additional field sources is that they uniquely decouple the homogeneity requirement from the field strength requirement. As a consequence, it is possible to get a stronger field in a homogenous region than heretofore possible utilizing the magnetic configuration like Jackson et al. from equivalent field sources. Moreover, since the signal-to-noise ratio in an NMR system is proportional to the field strength raised to the three-/halves power, the increased field strength results in a benefit that allows either penetrating more deeply into the rock formation 66 contiguous with the borehole (that is, away from the contaminated zone) and/or better vertical resolution and/or higher logging speed, thereby allowing logging to be completed more rapidly.

It also should be pointed out that the subject invention contemplates the creation of at least two concentric field regions, with the lower order spatial derivatives of the magnetic field of the inner region being zero, but with the higher order derivatives of the field in the surrounding region being large. The advantage of that structure is to allow the isolation of a particular region of rock formation (or other material to be analyzed) from its surroundings with regard to its contribution to NMR analysis.

It should also be pointed out that while the field created by the subject invention as described heretobefore is toroidal, other field shapes can be achieved by appropriate arrangement and dimensioning of the various magnetic elements in the structure so that all of the first and second order partial derivatives are at the desired values (e.g., zero) in the desired space. Moreover, the use of the additional field sources enables one to create a magnetic field in a region whose first order partial drivatives at preselected points within a region of the field are at respective predetermined values and whose second order partial derivative at preselected points with that region are at respective predetermined values. These predetermined values can be the same, e.g., zero, or different, so long as they are controllable and reproduceable by the selection and geometry of the additional field sources (magnets).

While the exact dimensions of each part of the magnetic structure of the subject invention for NMR well logging applications depend on many factors, such as borehole size, thickness expected of the contaminated region adjacent to the borehole, and degree of field uniformity needed, the following table gives typical dimensions for a viable magnetic structure for such use:

| Dimension | Value |
| --- | --- |
| Diameter of all magnets | 6 Inches (15.24 cm) |
| Lengths of magnets 22A and 22B | 24 inches (61 cm) |
| Distance between pole faces 26A and 26B of magnets 22A and 22B, respectively | 12 inches (30.48 cm) |
| Thickness of magnets 30A and 30B | 2 inches (5.1 cm) |
| Thickness of magnet 28 | 1 inch (2.54 cm) |

With a construction as set forth above the extent of the uniform field on the midplane 29 will range from a minimum of 5 inches (12.7 cm) to a maximum of 7 inches (17.78 cm) at a nominal field value of 360 Gauss.

Without further elaboration, the foregoing will so fully illustrate our invention that others may, by applying current or future knowledge, readily adopt the same for use under various conditions of service.

We claim:

1. Apparatus comprising at least first magnet means magnetized in a direction extending along a first predetermined axis and second magnet means magnetized in at least one direction extending at an angle to said first axis, said apparatus being arranged and structured to produce a substantially uniform magnetic field in a region external to said apparatus, said field have a predetermined magnitude but with its first order partial derivative with respect to spatial coordinates being respective predetermined values at preselected points within said region.

2. The apparatus of claim 1 wherein the second order partial derivatives of said field with respect to said spatial coordinates are respective predetermined values at preselected points within said region.

3. The apparatus of claim 1 additionally comprising third magnet means magnetized in at least one direction extending at an angle to said first axis.

4. The apparatus of claim 2 additionally comprising third magnet means magnetized in at least one direction extending at an angle to said first axis.

5. The apparatus of claim 1 additionally comprising a third magnet means and an RF coil means disposed adjacent to said second and third magnet means to produce electromagnetic fields suitable for nuclear magnetic resonance imaging.

6. The apparatus of claim 5 wherein the second order partial derivatives of said magnetic field with respect to said spatial coordinates are respective predetermined values at preselected points within said region.

7. The apparatus of claim 5, wherein said first magnet means comprises a pair of first elongated magnets, said magnets being axially aligned along said first axis but spaced from one another, each of said magnets having an end face defining a predetermined pole of said magnet, said magnets being disposed so that corresponding pole faces of said magnets are located opposite each other, said second magnet means comprising a pair of second magnets, each of said second magnets being disposed adjacent the end face of a respective one of said first magnets, said second magnets each being magnetized in directions extending radially to said first axis.

8. The apparatus of claim 7 wherein the second order partial derivatives of said field with respect to said spatial coordinates are respective predetermined values at preselected points within said region.

9. The apparatus of claim 7 wherein said third magnet means is magnetized in at least one direction extending at an angle to said first axis.

10. The apparatus of claim 9 wherein the second order partial derivatives of said field with respect to said spatial coordinates are respective predetermined values at preselected points within said region.

11. The apparatus of claim 3 wherein the second order partial derivatives of said field with respect to said spatial coordinates are respective predetermined values at preselected points within said region.

12. Apparatus for producing a substantially uniform magnetic field in a region external to said apparatus, said field having a predetermined magnitude but with it's first order partial derivatives with respect to spatial coordinates being respective predetermined values at preselected points within said region, said apparatus comprising at least first magnet means magnetized in a direction extending along a first predetermined axis and second magnet means magnetized in at least one direction extending at an angle to said first axis, said first magnet means comprising a pair of first elongated magnets, said magnets being axially aligned along said first axis but spaced from one another, each of said magnets having an end face defining a predetermined pole of said magnet, said magnets being disposed so that corresponding pole faces of said magnets are located opposite each other, said second magnet means comprising a pair of second magnets, each of said second magnets being disposed adjacent the end face of a respective one of said first magnets, said second magnets each being magnetized in directions extending radially to said first axis.

13. Apparatus for producing a substantially uniform magnetic field in a region external to said appartus, said field having a predetermined magnitude but with it's first order partial derivatives with respect to spatial coordinates being respective predetermined values at preselected points within said region, said apparatus comprising at least first magnet means magnetized in a direction extending along a first predetermined axis and second magnet means magnetized in at least one direction extending at an angle to said first axis and with the second order derivatives of said field with respect to said spatical coordinates being respective predetermined values at preselected points within said region, said first magnet means comprising a pair of first elongated magnets, said magnets being axially aligned along said first axis but spaced from one another, each of said magnets having an end face defining a predetermined pole of said magnet, said magnets being disposed so that corresponding pole faces of said magnets are located opposite each other, said second magnet means comprising a pair of second magnets, each of said second magnets being disposed adjacent the end face of a respective one of said first magnets, said second magnets each being mangetized in directions extending radially to said first axis.

14. Apparatus for producing a substantially uniform magnetic field in a region external to said apparatus, said field having a predetermined magnitude but with it's first order partial derivatives with respect to spatial coordinates being respective predetermined values at preselected points within said region, said apparatus comprising at least first magnet means magnetized in a direction extending along a first predetermined axis, second magnet means magnetized in at least one direction extending at an angle to said first axis, and third magnet means magnetized in at least one direction extending at an angle to said first axis, said first magnet means comprising a pair of first elongated magnets, said magnets being axially aligned along said first axis but spaced from one another, each of said magnets having an end face defining a predetermined pole of said magnet, said magnets being disposed so that corresponding pole faces of said magnets are located opposite each other, said second magnet means comprising a pair of second magnets, each of said second magnets being disposed adjacent the end face of a respective one of said first magnets, said second magnets each being magnetized in directions extending radially to said first axis and wherein said third multiple magnet means comprise a third magnet magnetized in directions extending radially to said first axis and being located between said second magnets.

15. Apparatus for producing a substantially uniform magnetic field in a region external to said apparatus, said field having a predetermined magnitude but with it's first order partial derivatives with respect to spatial coordinates being respective predetermined values at preselected points within said region, said apparatus comprising at least first magnet means magnetized in a direction extending along a first predetermined axis, second magnet means magnetized in at least one direction extending at an angle to said first axis, and with the second order derivatives of said field with respect to said spatial coordinates being respective predetermined values at preselected points within said region, and third magnet means magnetized in at least one direction extending at an angle to said first axis, said first magnet means comprising a pair of first elongated magnets, said magnets being axially aligned along said first axis but spaced from one another, each of said magnets having an end face defining a predetermined pole of said magnet, said magnets being disposed so that corresponding pole faces of said magnets are located opposite each other, said second magnet means comprising a pair of second magnets, each of said second magnets being disposed adjacent the end face of a respective one of said first magnets, said second magnets each being magnetized in directions extending radially to said first axis and wherein said third multiple magnet means comprise a third magnet magnetized in directions extending radially to said first axis and being located between said second magnets.

16. Apparatus for producing a substantially uniform magnetic field in a region external to said apparatus, said field having a predetermined magnitude but with it's first order partial derivatives with respect to spatial coordinates being respective predetermined values at preselected points within said region, said apparatus comprising at least first magnet means magnetized in a direction extending along a first predetermined axis, second magnet means magnetized in at least one direction extending at an angle to said first axis, and third magnet means magnetized in at least one direction extending at an angle to said first axis, said uniform field region being substantially toroidally shaped.

17. The apparatus of claim 16 wherein the second order partial derivatives of said field with respect to said spatial coordinates are respective predetermined values at preselected points within said region.

18. Apparatus for producing a substantially uniform magnetic field in a region external to said apparatus, said field having a predetermined magnitude but with it's first order partial derivatives with respect to spatial coordinates being respective predetermined values at preselected points within said region, said apparatus comprising at least first magnet means magnetized in a direction extending along a first predetermined axis, second magnet means magnetized in at least one direction extending at an angle to said first axis, and third magnet means magnetized in at least one direction extending at an angle to said first axis, each of said magnet means is a permanent magnet.

19. The apparatus of claim 18, wherein said second magnets are each shaped as annular cylinders, each of said cylinders being disposed adjacent a respective end face of said first magnets, said annular cylinders having an outer face defining a pole corresponding to the pole of the nearest end faces of each of said first magnets.

20. The apparatus of claim 19 wherein the second order partial derivatives of said field with respect to said spatial coordinates are respective predetermined values at preselected points within said region.

21. The apparatus of claim 19 wherein each of said annular cylinders comprises a multiplicity of trapezoidal segments.

22. The apparatus of claim 21, wherein the trapezoidal segments making up each annular cylinder are bonded to one another to form said cylinder.

23. The apparatus of claim 19, wherein said apparatus comprises a third magnet means and said third magnet comprises an annular cylinder having an outer surface, with said outer surface defining the corresponding pole to that of the outer surface of said second magnets.

24. The apparatus of claim 23 wherein the second order partial derivatives of said field with respect to said spatial coordinates are respective predetermined values at preselected points within said region.

25. The apparatus of claim 23, wherein the annular cylinder forming said third magnet comprising plural trapezoidal segments.

26. The apparatus of claim 19 additionally comprising third magnet means magnetized in at least one direction extending at an angle to said first axis.

27. The apparatus of claim 26 wherein said first magnet means comprises a pair of first elongated magnets, said magnets being axially aligned along said first axis but spaced from one another, each of said magnets having an end face defining a predetermined pole of said magnet, said magnets being disposed so that corresponding pole faces of said magnets are located opposite each other, said second magnet means comprising a pair of second magnets, each of said second magnets being disposed adjacent the end face of a respective one of said first magnets, said second magnets each being magnetized in directions extending radially to said first axis and wherein said third multiple magnet means comprise a third magnet magnetized in directions extending radially to said first axis and being located between said second magnets.

28. The apparatus of claim 19 additionally comprising third magnet means and RF coil means disposed adjacent to said second and third magnet means to produce electromagnetic fields suitable for nuclear magnetic resonance imaging.

29. The apparatus of claim 28 wherein the second order partial derivatives of said magnetic field with respect to said spatial coordinates are respective predetermined values at preselected points within said region.

30. The apparatus of claim 28 wherein said first magnet means comprises a pair of first elongated magnets, said magnets being axially aligned along said first axis but spaced from one another, each of said magnets having an end face defining a predetermined pole of said magnet, said magnets being disposed so that corresponding pole faces of said magnets are located opposite each other, said second magnet means comprising a pair of second magnets, each of said second magnets being disposed adjacent the end face of a respective one of said first magnets, said second magnets each being magnetized in directions extending radially to said first axis.

31. The apparatus of claim 30 wherein the second order partial derivatives of said field with respect to said spatial coordinates are respective predetermined values at preselected points within said region.

32. The apparatus of claim 30 wherein said third magnet means is magnetized in at least one direction extending at an angle to said first axis and wherein each of said magnet means is a permanent magnet.

33. The apparatus of claim 32 wherein the second order partial derivatives of said field with respect to said spatial coordinates are respective predetermined values at preselected points within said region.

34. The apparatus of claim 23 wherein said third magnet means is magnetized in at least one direction extending at an angle to said first axis and each of said magnet means is a permanent magnet.

35. The apparatus of claim 34 wherein said first magnet means comprises a pair of first elongated magnets, said magnets being axially aligned along said first axis but spaced from one another, each of said magnets having an end face defining a predetermined pole of said magnet, said magnets being disposed so that corresponding pole faces of said magnets are located opposite each other, said second magnet means comprising a pair of second magnets, each of said second magnets being disposed adjacent the end face of a respective one of said first magnets, said second magnets each being magnetized in directions extending radially to said first axis and wherein said third magnet means comprise a third magnet magnetized in directions extending radially to said first axis and being located between said second magnets.

36. The apparatus of claim 23 wherein said third magnet means is magnetized in at least one direction extending at any angle to said first axis, each of said magnet means being a permanent magnet, and said apparatus comprises RF coil means disposed adjacent to said second and third magnets to produce electromagnetic fields suitable for nuclear magnetic resonance imaging.

37. The apparatus of claim 36 wherein the second order partial derivatives of said magnetic field with respect to said spatial coordinates are respective predetermined values at preselected points within said region.

38. The apparatus of claim 36 wherein said first magnet means comprises a pair of first elongated magnets, said magnets being axially aligned along said first axis but spaced from one another, each of said magnets having an end face defining a predetermined pole of said magnet, said magnets being disposed so that corresponding pole faces of said magnets are located opposite each other, said second magnet means comprising a pair of second magnets, each of said second magnets being disposed adjacent the end face of a respective one of said first magnets, said second magnets each being magnetized in directions extending radially to said first axis.

39. The apparatus of claim 38 wherein the second order partial derivatives of said field with respect to said spatial coordinates are respective predetermined values at preselected points within said region.

40. Apparatus for producing a substantially uniform magnetic field in a region external to said apparatus, said field having a predetermined magnitude but with it's first order partial derivatives with respect to spatial coordinates being respective predetermined values at preselected points within said region, said apparatus comprising at least first magnet means magnetized in a direction extending along a first predetermined axis, second magnet means magnetized in at least one direction extending at an angle to said first axis, and third magnetic means, each of said magnet means being a permanent magnet, said first magnet means comprising a pair of first elongated magnets, said magnets being axially aligned along said first axis but spaced from one another, each of said magnets having an end face defining a predetermined pole of said magnet, said magnets being disposed so that corresponding pole faces of said magnets are located opposite each other, said second magnet means comprising a pair of second magnets, each of said second magnets being disposed adjacent the end face of a respective one of said first magnets, said second magnets each being magnetized in directions extending radially to said first axis and wherein said third magnet means comprise a third magnet magnetized in directions extending radially to said first axis and being located between said second magnets.

41. Apparatus for producing a substantially uniform magnetic field in a region external to said apparatus, said field having a predetermined magnitude but with it's first order partial derivatives with respect to spatial coordinates being respective predetermined values at preselected points within said region, said apparatus comprising at least first magnet means magnetized in a direction extending along a first predetermined axis and second magnet means magnetized in at least one direction extending at an angle to said first axis, said apparatus comprising a third magnetic means each of said magnets being a permanent magnet, said apparatus additionally comprising third magnet means magnetized in at least one direction extending at an angle to said first axis, and RF coil means disposed adjacent to said second and third magnet means to produce electromagnetic fields suitable for nuclear magnetic resonance imaging.

42. The apparatus of claim 41 wherein the second order partial derivatives of said magnetic field with respect to said spatial coordinates are respective predetermined values at preselected points within said region.

43. The apparatus of claim 41 wherein said first magnet means comprises a pair of first elongated magnets, said magnets being axially aligned along said first axis but spaced from one another, each of said magnets having an end face defining a predetermined pole of said magnet, aid magnets being disposed so that corresponding pole faces of said magnets are located opposite each other, said second magnet means comprising a pair of second magnets, each of said second magnets being disposed adjacent the end face of a respective one of said first magnets, said second magnets each being magnetized in directions extending radially to said first axis.

44. The apparatus of claim 43 wherein the second order partial derivatives of said field with respect to said spatial coordinates are respective predetermined values at preselected points within said region.

45. The apparatus of claim 43 wherein said third magnet means is magnetized in at least one direction extending at an angle to said first axis.

46. The apparatus of claim 45 wherein the second order partial derivatives of said field with respect to said spatial coordinates are respective predetermined values at preselected points within said region.

* * * * *